(12) United States Patent
Bae et al.

(10) Patent No.: US 8,628,911 B2
(45) Date of Patent: *Jan. 14, 2014

(54) POLYMERS, PHOTORESIST COMPOSITIONS AND METHODS OF FORMING PHOTOLITHOGRAPHIC PATTERNS

(75) Inventors: Young Cheol Bae, Weston, MA (US); David Richard Wilson, Midland, MI (US); Jibin Sun, Worcester, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 60 days.

This patent is subject to a terminal disclaimer.

(21) Appl. No.: 13/309,843

(22) Filed: Dec. 2, 2011

(65) Prior Publication Data

US 2012/0308927 A1  Dec. 6, 2012

Related U.S. Application Data

(60) Provisional application No. 61/419,156, filed on Dec. 2, 2010.

(51) Int. Cl.
*G03F 7/26* (2006.01)
*G03F 7/32* (2006.01)

(52) U.S. Cl.
USPC ........ 430/434; 430/270.1; 430/326; 430/435; 430/910

(58) Field of Classification Search
USPC ........ 430/270.1, 326, 434, 435, 910; 526/318
See application file for complete search history.

(56) References Cited

U.S. PATENT DOCUMENTS

| | | | |
|---|---|---|---|
| 5,738,975 A | 4/1998 | Nakano et al. | |
| 6,790,579 B1 | 9/2004 | Goodall et al. | |
| 2005/0175927 A1* | 8/2005 | Kishioka et al. | 430/270.1 |
| 2008/0187860 A1* | 8/2008 | Tsubaki et al. | 430/270.1 |
| 2009/0176177 A1 | 7/2009 | Han et al. | |
| 2010/0330507 A1 | 12/2010 | Tsubaki et al. | |
| 2012/0064456 A1* | 3/2012 | Bae et al. | 430/270.1 |
| 2012/0171617 A1* | 7/2012 | Bae et al. | 430/285.1 |
| 2013/0011783 A1* | 1/2013 | Ober et al. | 430/270.1 |

FOREIGN PATENT DOCUMENTS

| | | |
|---|---|---|
| EP | 1447 403 A1 | 8/2004 |
| JP | 2008 281975 A | 11/2008 |
| WO | WO 2011/083872 A1 | 7/2011 |
| WO | WO 2011/105626 A1 | 9/2011 |

OTHER PUBLICATIONS

J. Havard et al.; "Photoresists with Reduced Environmental Impact: Water Soluble Resists Based on Photo-Cross-Linking of a Sugar-Containing Polymethacrylate"; *Macromolecules* 1999, 32, pp. 86-94.

L. Van Look et al.; "Printing the Metal and Contact Layers for the 32 and 22 nm Node: Comparing positive and negative Tone Development Process"; Proc. of SPIE, vol. 7640; 2010; pp. 764011-1-764011-12.

V. Truffert et al.; "Ultimate contact hole resolution using immersion lithography with line/space imaging"; Proc. of SPIE, vol. 7274; 2009; pp. 72740N-1-72740-12.

European Search Report of corresponding European Application No. 11 19 1270.

JP 2008 281975 A—Thompson Innovation English Language Translation.

* cited by examiner

*Primary Examiner* — Anca Eoff

(74) *Attorney, Agent, or Firm* — Jonathan D. Baskin

(57) ABSTRACT

Provided are polymers and photoresist compositions useful in forming photolithographic patterns. Also provided are substrates coated with the photoresist compositions and methods of forming photolithographic patterns. The compositions, methods and coated substrates find particular applicability in the manufacture of semiconductor devices.

11 Claims, 3 Drawing Sheets

POLYMERS, PHOTORESIST COMPOSITIONS AND METHODS OF FORMING PHOTOLITHOGRAPHIC PATTERNS

CROSS-REFERENCE TO RELATED APPLICATIONS

This application claims the benefit of priority under 35 U.S.C. §119(e) to U.S. Provisional Application No. 61/419,156, filed Dec. 2, 2010, the entire contents of which are incorporated herein by reference.

FIELD

The invention relates generally to the manufacture of electronic devices. More specifically, this invention relates to polymers, photoresist compositions, coated substrates and to photolithographic methods which allow for the formation of fine patterns using a negative tone development process.

INTRODUCTION

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium.

The theoretical resolution limit as defined by the Rayleigh equation is shown below:

$$R = k_1 \frac{\lambda}{NA}$$

where $k_1$ is the process factor, $\lambda$ is the wavelength of the imaging tool and NA is the numerical aperture of the imaging lens. When using water as the immersion fluid, the maximum numerical aperture can be increased, for example, from 1.2 to 1.35. For a $k_1$ of 0.25 in the case of printing line and space patterns, 193 nm immersion scanners would only be capable of resolving 36 nm half-pitch line and space patterns. The resolution for printing contact holes or arbitrary 2D patterns is further limited due to the low aerial image contrast with a dark field mask wherein the theoretical limit for $k_1$ is 0.35. The smallest half-pitch of contact holes is thus limited to about 50 nm. The standard immersion lithography process is generally not suitable for manufacture of devices requiring greater resolution.

Considerable effort has been made to extend the practical resolution capabilities of positive tone development in immersion lithography from both a materials and processing standpoint. One such example involves negative tone development (NTD) of a traditionally positive-type chemically amplified photoresist. NTD is an image reversal technique allowing for use of the superior imaging quality obtained with bright field masks for printing the critical dark field layers. NTD resists typically employ a resin having acid-labile (or acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by particular developers, typically organic developers such as ketones, esters or ethers, leaving behind a pattern created by the insoluble exposed regions. Such a process is described, for example, in U.S. Pat. No. 6,790,579, to Goodall et al. That document discloses a photoresist composition comprising an acid-generating initiator and a polycyclic polymer containing recurring acid labile pendant groups along the polymer backbone. The exposed areas can be selectively removed with an alkaline developer or, alternatively, the unexposed regions can be selectively removed by treatment with a suitable nonpolar solvent for negative tone development.

Certain problems can result when applying conventional 193 nm photoresists to the NTD process. The developed photoresist pattern can, for example, demonstrate significant thickness loss as compared with the pre-exposed resist layer. This can give rise to pattern defects resulting from complete erosion of portions of the resist pattern during subsequent etching. Thickness loss is believed to be caused by cleavage and loss of commonly employed bulky acid labile groups such as large tertiary alkyl ester groups from the resist layer. Thickness loss for conventional 193 nm photoresists which rely solely on such bulky acid labile groups for polarity switching can be particularly problematic due to the high content of such groups. The use of a thicker resist layer may not be a practical solution as other issues such as reduction in the depth of focus and pattern collapse can then result. The occurrence of pattern collapse when using typical 193 nm photoresists for NTD is believed to be exacerbated by the relatively high content of (meth)acrylic acid units generated in exposed regions of the photoresist following cleavage of certain acid-labile groups from (meth)acrylate-based polymers especially where such groups are solely responsible for the polarity switch. The (meth)acrylic acid units contribute to poor adhesion on organic and Si-based inorganic substrates due to the polarity mismatch between resist patterns and substrates. Another problem associated with the use in NTD of such conventional photoresists relying solely on the aforementioned bulky acid labile groups for polarity switching is etch resistance reduction.

There is a continuing need in the art for improved polymers, photoresist compositions and photolithographic methods for negative tone development which allow for the formation of fine patterns in electronic device fabrication and which avoid or conspicuously ameliorate one or more of the foregoing problems associated with the state of the art.

SUMMARY

The photoresist compositions of the invention include a polymer formed in part from a monomer which includes a particular acetal moiety. Preferred compositions and methods of the invention can result in reduced thickness loss and improvement in pattern collapse margin, resolution and photospeed in photolithographic processing.

In accordance with the invention, polymers are provided. The polymers comprise:
a first unit formed from a monomer of the following general formula (I):

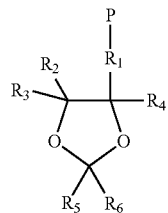

wherein: P represents a polymerizable group; $R_1$ represents a single bond, or a $C_1$ to $C_{10}$ linear or branched organic group; $R_2$ and $R_3$ each independently represents a hydrogen atom or a $C_1$ to $C_{10}$ organic group, together optionally forming a ring; $R_4$ represents a hydrogen atom or a $C_1$ to $C_{10}$ organic group; and $R_5$ and $R_6$ each independently represents a $C_1$ to $C_6$ organic group, together optionally forming a ring; and a second unit comprising a lactone moiety.

In accordance with a further aspect of the invention, photoresist compositions are provided. The photoresist compositions comprise a polymer as described herein and a photoacid generator.

Also provided are methods of forming photolithographic patterns. The methods comprise: (a) providing a substrate comprising one or more layer to be patterned over a surface of the substrate; (b) applying a layer of a photoresist composition of the invention as described herein over the one or more layer to be patterned; (c) patternwise exposing the photoresist composition layer to actinic radiation; (d) heating the exposed photoresist composition layer in a post-exposure bake process; and (e) applying a developer to the photoresist composition layer to remove a portion of the photoresist layer, thereby forming a photoresist pattern. In a negative tone development method, unexposed regions of the photoresist layer are removed by the developer to form the photoresist pattern. In a positive tone development method, exposed regions of the photoresist layer are removed by the developer to form the photoresist pattern.

Also provided are coated substrates. The coated substrates comprise a substrate and a layer of a photoresist composition of the invention as described herein over a surface of the substrate.

Also provided are electronic devices formed by the methods described herein.

As used herein: "g" means grams; wt % means weight percent; "L" means liter; "mL" means milliliter; "nm" means nanometer; "mm" means millimeter; "min" means minute; "h" means hour; "Å" means Angstroms; "mol %" means mole percent; "Mw" means weight average molecular weight; and "Mn" means number average molecular weight; the articles "a" and "an" mean one or more.

BRIEF DESCRIPTION OF THE DRAWINGS

The present invention will be described with reference to the following drawings, in which like reference numerals denote like features, and in which.

DETAILED DESCRIPTION

Polymers

Figure 1A:
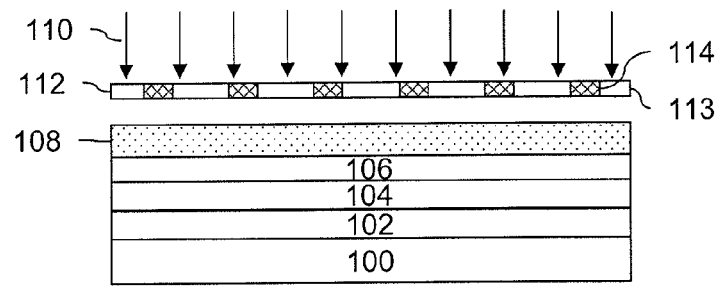
FIG. 1A-E illustrates a process flow for forming a photolithographic pattern in accordance with the invention.

The polymers of the invention include a first unit formed from a monomer that includes a moiety having a ring structure and an acetal group. The two oxygen atoms and secondary carbon atom ("acetal secondary carbon atom") bonded to the oxygen atoms, characteristic of the acetal group, form a portion of the ring structure. Bonded to this acetal secondary carbon atom is a structure which can take the form of two groups pendant to the ring structure or which together with the acetal secondary carbon atom can take the form of a ring structure. The acetal secondary carbon atom together with the pendant group(s) are acid labile, undergoing a photoacid-promoted deprotection reaction on exposure to activating radiation and heat treatment. The resulting cleavage of the acetal secondary carbon atom and pendant group(s) is believed to result in the formation of hydroxy groups with the former acetal oxygen atoms. This causes the polymer to become less soluble in an organic solvent used to develop the resist layer allowing for the formation of a negative-type image.

More particularly, the polymer includes a first unit formed from a monomer of the following general formula (I):

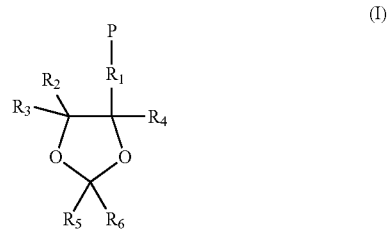

wherein: P represents a polymerizable group; $R_1$ represents a single bond, or a $C_1$ to $C_{10}$ linear or branched organic group such as a $C_1$ to $C_{10}$ or $C_1$ to $C_6$ linear or branched alkylene group, or a $C_2$ to $C_{10}$ or $C_2$ to $C_6$ linear or branched alkenylene group; $R_2$ and $R_3$ each independently represents a hydrogen atom or a $C_1$ to $C_{10}$ organic group such as a $C_1$ to $C_{10}$ or $C_1$ to $C_6$ alkyl, aldehyde, alkoxycarbonyl, benzyloxymethyl, phenylsulfonyloxymethyl or tosyloxymethyl group, $R_2$ and $R_3$ together optionally forming a ring such as a $C_3$ to $C_6$ or $C_4$ to $C_6$ cycloalkyl ring; $R_4$ represents a hydrogen atom or a $C_1$ to $C_{10}$ organic group such as a $C_1$ to $C_{10}$ or $C_1$ to $C_6$ alkyl alkyl or $C_2$ to $C_{10}$ or $C_2$ to $C_6$ alkenyl group; and $R_5$ and $R_6$ each independently represents a $C_1$ to $C_6$ organic group such as a $C_1$ to $C_6$ alkyl or acetyloxy group, $R_5$ and $R_6$ together optionally forming a ring such as a $C_3$ to $C_6$ or $C_4$ to $C_6$ cycloalkyl ring. The $R_1$, $R_2$, $R_3$, $R_4$, $R_5$ and $R_6$ groups can optionally be substituted, meaning that one or more hydrogen atom can be replaced by another atom or group.

The polymerizable functional group in the monomer can be chosen, for example, from (alkyl)acrylate, vinyl and non-aromatic cyclic olefins (endocyclic double bond) such as norbornene, such as those of the following general formulae (P-A), (P-B) and (P-C), respectively:

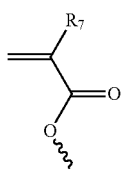
(P-A)

wherein R₇ is chosen from hydrogen and C1 to C3 alkyl;

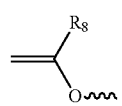
(P-B)

wherein R₈ is chosen from hydrogen and C1 to C3 alkyl; and

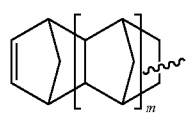
(P-C)

wherein m is an integer from 0 to 3. R₇ can optionally be substituted, for example, by replacing one or more hydrogen atom with a halogen such as fluorine. Preferably, the polymerizable group of the monomer and other monomer units is an (alkyl)acrylate group of formula (P-A), typically acrylate or methacrylate. While the content of the first unit and other units in the polymer will depend on the number and type of different units making up the polymer, the first unit is typically present in the polymer in an amount of from 30 to 60 mol %.

Without limitation, suitable monomers of Formula (I) include, for example, the following:

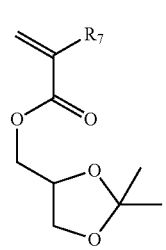 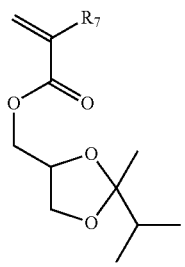 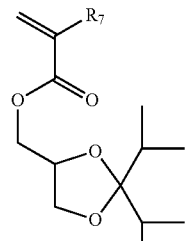

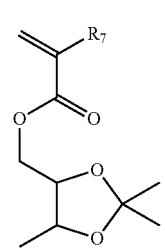 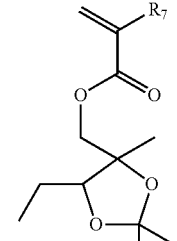 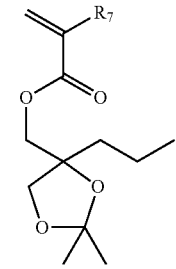

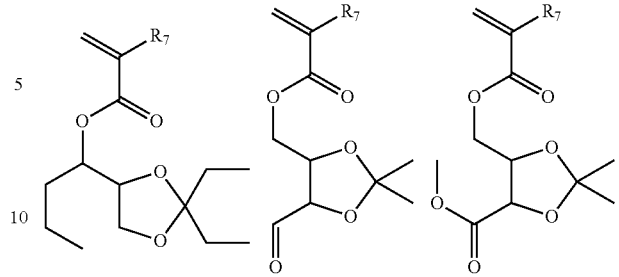

-continued

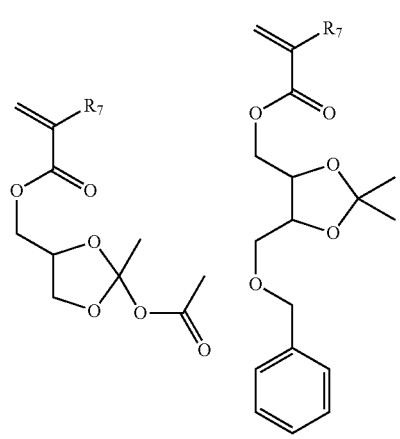

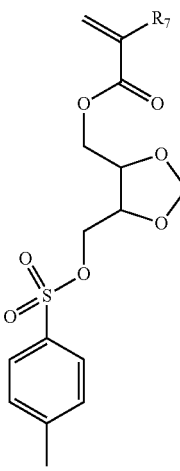 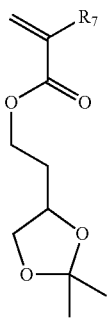 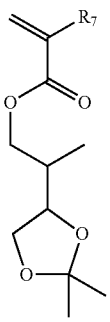

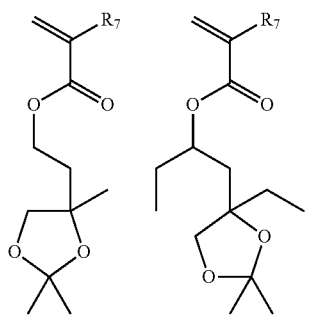 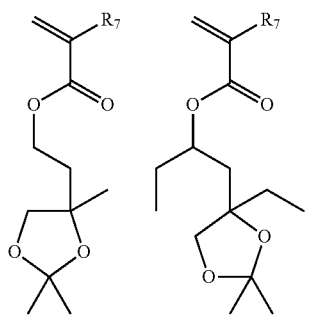 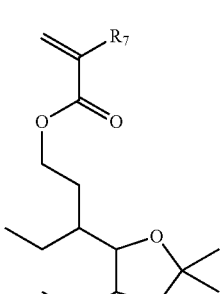

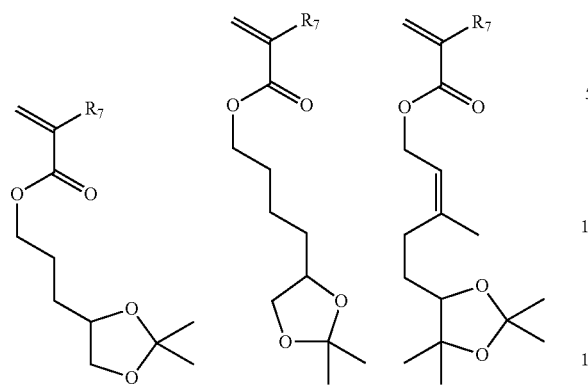

wherein $R_7$ is as defined above as being chosen from hydrogen and C1 to C3 alkyl, preferably hydrogen or methyl. While (alkyl)acrylate polymerizable groups have been exemplified in the above monomers, it should be clear that other polymerizable groups such as those of above-described formulae (P-B) and (P-C) can be used in place thereof. Suitable monomers of Formula (I) are commercially available and/or can be synthesized using known methods, for example, esterification of the corresponding alcohol with methacryloyl chloride.

The polymer further includes a second unit formed from a monomer comprising a lactone moiety. The second unit is typically present in the polymer in an amount of from 20 to 60 mol %. Suitable such lactone moieties are known in the art and include, for example, those of the following formulae:

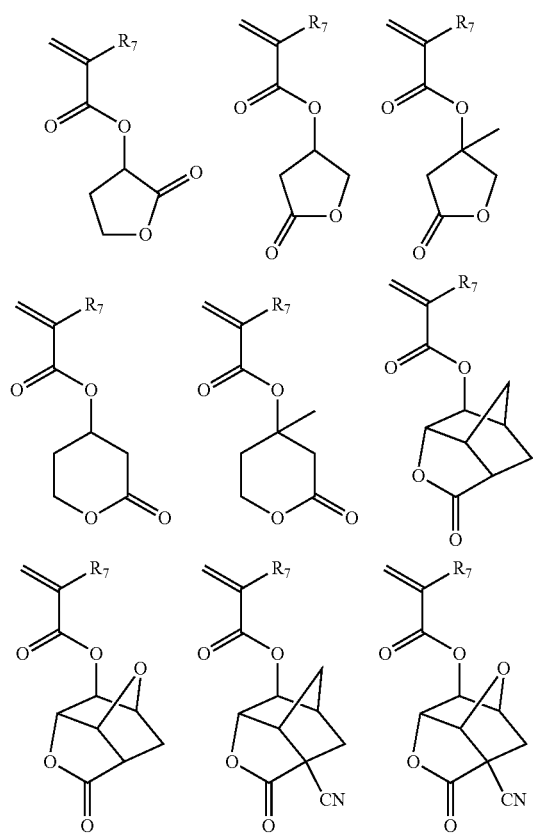

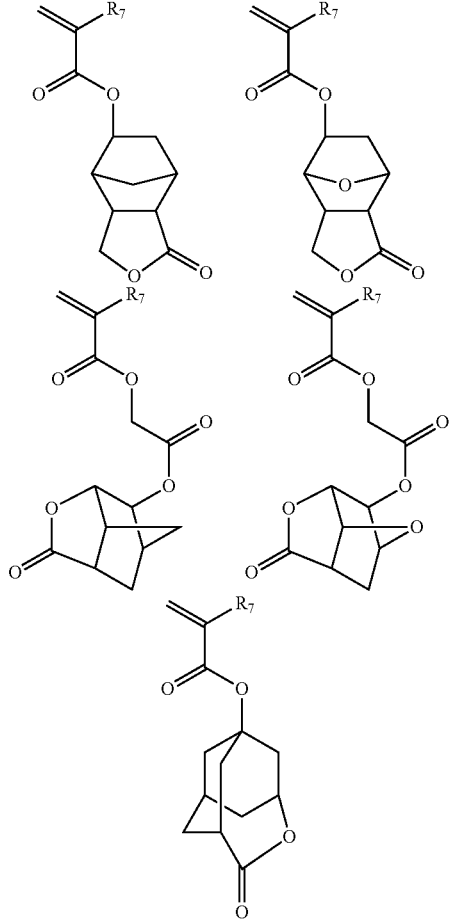

wherein $R_7$ is as defined above as being chosen from hydrogen and C1 to C3 alkyl, preferably hydrogen or methyl. While (alkyl)acrylate polymerizable groups have been exemplified in the above monomers, it should be clear that other polymerizable groups such as those of above-described formulae (P-B) and (P-C) can be used in place thereof. Suitable monomers for the second unit are commercially available and/or can be synthesized using known techniques.

In addition to the first and second units described above, the polymer can include one or more additional units. Typically, the additional units will include the same polymerizable group as that used for the monomers of the first and/or second units but may include different polymerizable groups, for example, those of formula (P-A), (P-B) and/or (P-C) as described above, in the same polymer backbone. Suitable additional monomeric units for the polymer include, for example, one or more of the following: monomeric units formed from a monomer comprising a moiety of formula (I) which is different from the first unit; monomeric units containing ethers, lactones or esters, such as 2-methyl-acrylic acid tetrahydro-furan-3-yl ester, 2-methyl-acrylic acid 2-oxo-tetrahydro-furan-3-yl ester, 2-methyl-acrylic acid 5-oxo-tetrahydro-furan-3-yl ester, 2-methyl-acrylic acid 3-oxo-4,10-dioxa-tricyclo[5.2.1.0²,⁶]dec-8-yl ester, 2-methyl-acrylic acid 3-oxo-4-oxa-tricyclo[5.2.1.0²,⁶]dec-8-yl ester, 2-methyl-acrylic acid 5-oxo-4-oxa-tricyclo[4.2.1.0³,⁷]non-2-yloxycarbonylmethyl ester, acrylic acid 3-oxo-4-oxa-tricyclo[5.2.1.0²,⁶]dec-8-yl ester, 2-methyl-acrylic acid 5-oxo-4-oxa-tricyclo[4.2.1.0³,⁷]non-2-yl ester, and 2-methyl-acrylic acid tetrahydro-furan-3-yl ester; monomeric units having polar groups such as alcohols and fluorinated alcohols, such as 2-methyl-acrylic acid 3-hydroxy-adamantan-1-yl ester, 2-methyl-acrylic acid 2-hydroxy-ethyl ester, 6-vinyl-naphthalen-2-ol, 2-methyl-acrylic acid 3,5-dihydroxy-adamantan-1-yl ester, 2-methyl-acrylic acid 6-(3,3,3-trifluoro-2-hydroxy-2-trifluoromethyl-propyl)-bicyclo[2.2.1]hept-2-yl, and 2-bicyclo[2.2.1]hept-5-en-2-ylmethyl-1,1,1,3,3,3-hexafluoro-propan-2-ol; monomeric units having acid labile moieties, for example, ester groups that contain a tertiary non-cyclic alkyl carbon such as t-butyl, or a tertiary alicyclic carbon such as methyladamantyl or ethylfenchyl covalently linked to a carboxyloxygen of an ester of the polymer, 2-methyl-acrylic acid 2-(1-ethoxy-ethoxy)-ethyl ester, 2-methyl-acrylic acid 2-ethoxymethoxy-ethyl ester, 2-methyl-acrylic acid 2-methoxymethoxy-ethyl ester, 2-(1-ethoxy-ethoxy)-6-vinyl-naphthalene, 2-ethoxymethoxy-6-vinyl-naphthalene, and 2-methoxymethoxy-6-vinyl-naphthalene. Suitable monomers for such additional units are commercially available and/or can be synthesized using known methods. The additional units are typically present in the polymer in an amount of from 40 to 70 mol %.

For imaging at sub-200 nm wavelengths such as 193 nm, the polymer is typically substantially free (e.g., less than 15 mol %) of phenyl, benzyl or other aromatic groups where such groups are highly absorbing of the radiation. The polymer can contain repeat units that contain a hetero atom, particularly oxygen and/or sulfur, for example, one or more chosen from: heteroalicyclic units fused to the polymer backbone; fused carbon alicyclic units such as provided by polymerization of a norbornene group; and carbocyclic aryl units substituted with one or more hetero-atom-containing (e.g., oxygen or sulfur) groups, for example, hydroxy naphthyl groups.

Preferred polymers in accordance with the invention include, for example, the following:

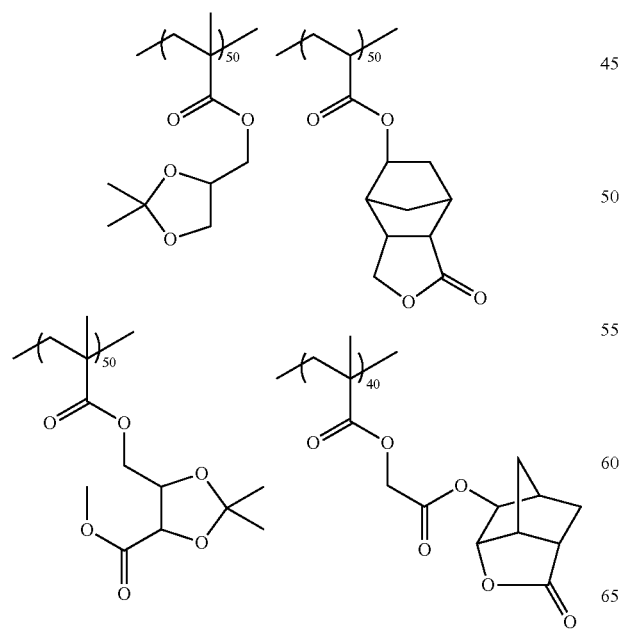

-continued

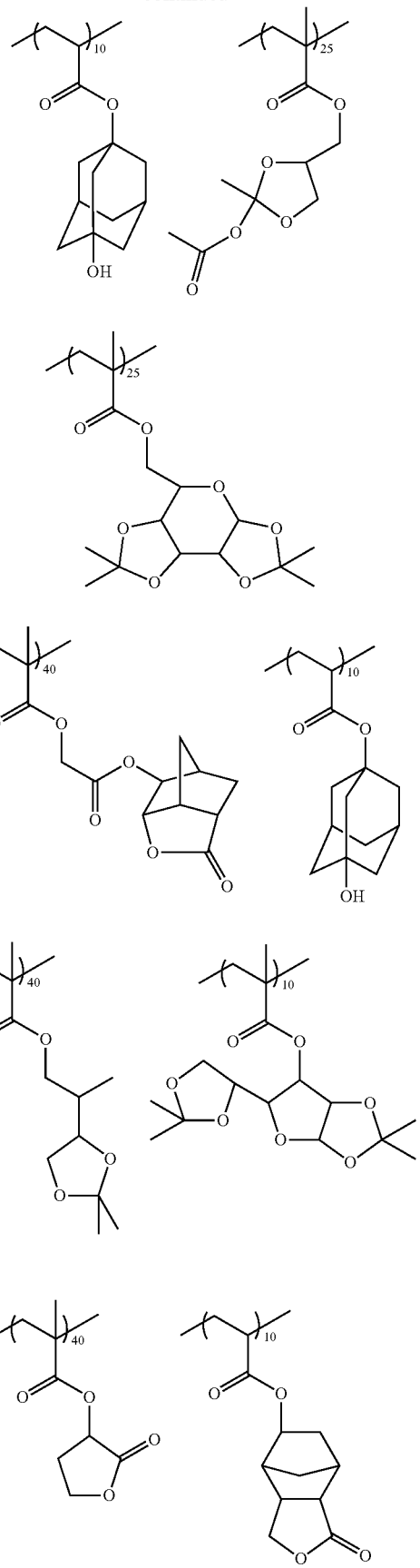

-continued

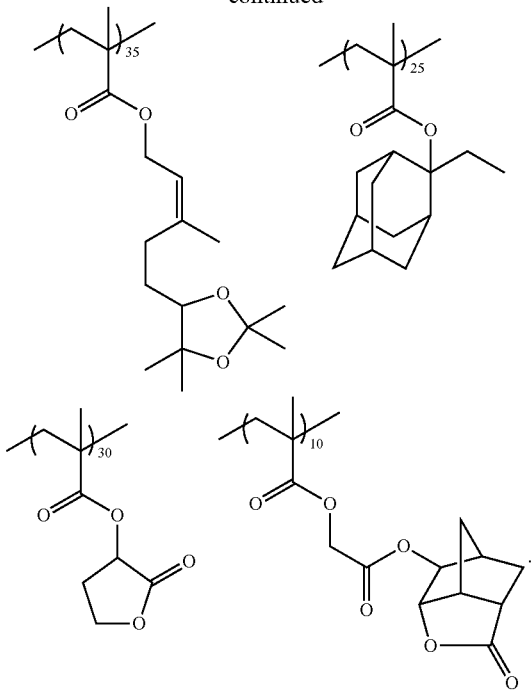

The weight average molecular weight $M_w$ of the polymers of the invention is typically less than 100,000, for example, from 5000 to 50,000, more typically from 7000 to 30,000 or from 10,000 to 25,000.

Suitable polymers in accordance with the invention can readily be synthesized by persons skilled in the art using known methods and commercially available starting materials. The polymers can be synthesized, for example, by first dissolving the polymerizable group-containing monomers in a suitable organic solvent, for example, tetrahydrofuran, dioxane, ethyl acetate, dimethyl formamide, propylene glycol methyl ether acetate (PGMEA), methylene chloride, chloroform, acetone, methyl ethyl ketone or the like, and degassing. A radical initiator can be dissolved in a suitable solvent which is the same or different from that used for the monomer dissolution, and then added to the monomer solution. Suitable radical initiators include, for example, 2,2'-azobisisobutyronitrile (AIBN), dimethyl 2,2'-azobis(2-methylpropionate) (Vazo™601, DuPont), 2,2'-azobis(2,4-dimethyl)valeronitrile (Vazo™52, DuPont) and 2,2-azobis(2-methylbutane-nitrile) (Vazo™67, DuPont). A reaction vessel is charged with a solvent which is the same or different from that used for the monomer solution and is heated to a temperature of from 40 to 140° C., typically from 70 to 80° C. The initiator solution can then be added to the reaction vessel, and the monomer solution added in a drop-wise manner to the vessel. The reaction mixture can be cooled and slowly added to a rapidly stirred non-solvent for precipitation. Suitable non-solvents include, for example, water, alcohols, alkanes, ethers, and combinations thereof. The polymer is collected, optionally rinsed with a small amount of non-solvent and dried. For further purification, the polymer can be re-dissolved in a suitable solvent, precipitated and dried.

Photoresist Compositions

Preferred photoresist compositions of the invention when used to form very fine patterns in a negative tone development process can provide improvements in one or more of resolution, top loss, pattern collapse, focus latitude, exposure latitude, photospeed and defectivity as compared with conventional positive-tone photolithographic techniques. Preferred photoresists can further provide geometrically uniform resist patterns for lines and contact holes. The compositions described herein can be used in dry lithography or immersion lithography processes.

A. Matrix Polymer

The photoresist compositions include a matrix polymer such as described above. The matrix polymer as part of a layer of the photoresist composition undergoes a change in solubility in an organic developer as a result of reaction with acid generated from the photoacid generator following softbake, exposure to activating radiation and post exposure bake.

The matrix polymer is present in the resist composition in an amount sufficient to obtain a uniform coating of desired thickness. Typically, the matrix polymer is present in the composition in an amount of from 70 to 95 wt % based on total solids of the resist composition.

B. Photoacid Generator

The photosensitive composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

C. Solvent

Suitable solvents for the photoresist compositions of the invention include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

D. Other Components

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of resist compositions of the invention is an added base, for example, a caprolactam, which can enhance resolution of a developed resist relief image. Other suitable basic additives include: alkyl amines such as tripropylamine and dodecylamine, aryl amines such as diphenylamine, triphenylamine, aminophenol, 2-(4-aminophenyl)-2-(4-hydroxyphenyepropane, and the like. The added base is suitably used in relatively small amounts, for example, from 0.01 to 5 wt %, preferably from 0.1 to 2 wt %, based on total solids of the photoresist composition.

Surface active polymers can optionally be used as an additive in the photoresist formulation in order to simplify the immersion lithographic process by avoiding the need for a top-coat layer over the resist layer. Top-coat layers are typically used to prevent resist components such as photoacid generators from contaminating the imaging lens surface. Surface active polymer additives added to the photoresist formulations migrate to the surface during the coating process due to their relatively low surface free energy. The surface active polymer additives should have a lower surface free energy than the matrix polymer to allow the surface active polymer to migrate to the surface. A typical surface free energy of the surface active polymer additives is from 10 to 40 $mJ/m^2$. Suitable surface active polymers are known in the art and include, for example, those disclosed by Tsibouklis and Nevell (Advanced Materials, 2003, 15, pp. 647-650). Exemplary suitable polymer additives include, for example, poly(n-butyl acrylate), poly(n-butyl methacrylate), poly(1-butyl acrylate), poly(1-butyl methacrylate), poly(diethyl siloxane), poly(vinyl butyrate), polytetrahydrofuran, poly(propylene glycol), poly(tetramethylene oxide) and fluorinated polymers. The one or more additive polymer typically may be present in the photoresist composition in relatively small amounts and still provide effective results. The content of the additive polymer may depend, for example, on whether the lithography is a dry or immersion-type process. For example, the additive polymer lower limit for immersion lithography is generally dictated by the need to prevent leaching of the resist components. A higher additive polymer content will typically result in pattern degradation. The one or more polymer additive is typically present in the compositions of the invention in an amount of from 0.1 to 10 wt %, more typically from 1 to 5 wt %, based on total solids of the photoresist composition. The weight average molecular weight of the additive polymer is typically less than 400,000, for example from 5000 to 50,000.

Preparation of Photoresist Compositions

The photoresists used in accordance with the invention are generally prepared following known procedures. For example, a photoresist composition of the invention can be prepared by dissolving the components of the photoresist in the solvent component. The desired total solids content of the photoresist will depend on factors such as the particular polymers in the composition, final layer thickness and exposure wavelength. Typically the solids content of the photoresist is from 1 to 10 wt %, more typically from 2 to 5 wt %, based on the total weight of the photoresist composition.

Photoresist compositions of the invention find particular applicability in negative-tone development processes such as described below, but can be used in positive-tone development wherein exposed portions of the photoresist layer are removed in developer solutions.

Negative Tone Development Methods

The invention further provides methods for forming a photoresist relief image and producing an electronic device using photoresists of the invention. The invention also provides novel articles of manufacture comprising substrates coated with a photoresist composition of the invention. Processes in accordance with the invention will now be described with reference to FIG. 1A-E, which illustrates an exemplary process flow for forming a photolithographic pattern by negative tone development.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be patterned can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be patterned 102 will vary depending on the materials and particular devices being formed.

Depending on the particular layers to be patterned, film thicknesses and photolithographic materials and process to be used, it may be desired to dispose over the layers 102a hard mask layer 104 and/or a bottom antireflective coating (BARC) 106 over which a photoresist layer 108 is to be coated. Use of a hard mask layer 104 may be desired, for example, with very thin resist layers, where the layers to be patterned require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 104 can include a single layer or a plurality of layers of different materials. The hard mask layer can be formed, for example, by chemical or physical vapor deposition techniques.

A bottom antireflective coating 106 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating 106 can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist composition as described herein is applied on the substrate over the antireflective layer 106 (if present) to form a photoresist layer 108. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 108 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 108 is next exposed to activating radiation 110 through a first photomask 112 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 113, 114 corresponding to regions of the resist layer to remain and be removed, respectively, in a subsequent development step for a positive-acting material as illustrated. The exposure wavelength is typically sub-400 nm, sub-300 nm or sub-200 nm, with 248 nm and 193 nm being typical. The methods find use in immersion or dry (non-immersion) lithography techniques. The exposure energy is typically from about 10 to 80 mJ/cm$^2$, dependent upon the exposure tool and the components of the photosensitive composition.

Figure 1B:
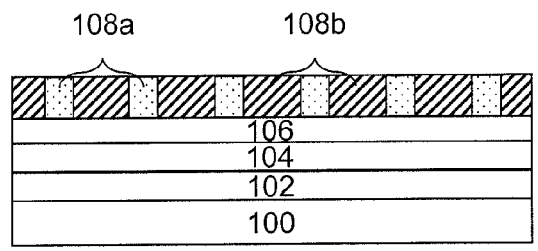

As shown in FIG. 1B, the exposed resist layer is made up of unexposed and exposed regions 108a, 108b. Following exposure of the photoresist layer 108, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1C:
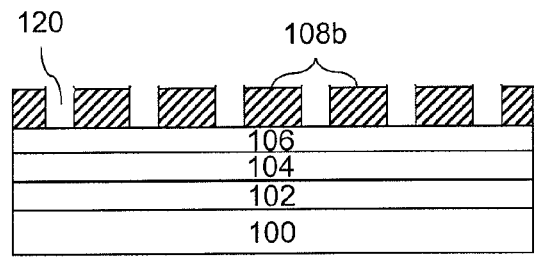

The exposed photoresist layer is next developed to remove unexposed regions 108a, leaving exposed regions 108b forming a resist pattern as shown in FIG. 1C. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Of these, 2-heptanone and 5-methyl-2-hexanone are particularly preferred. Other suitable solvents include those used in the photoresist composition.

The solvent can be present in the developer as a substantially pure material, for example, in an amount greater than 95 wt %, greater than 98 wt % or greater than 99 wt %, based on the total weight of the developer. In the case a mixture of solvents are used in the developer, the boiling points of the solvents are preferably similar. The solvents of the developer are typically present in an amount of from 50 wt % to 100 wt %, more typically from 80 wt % to 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature. The development process can be conducted without use of a cleaning rinse following development. In this regard, it has been found that the development process can result in a residue-free wafer surface rendering such extra rinse step unnecessary.

Figure 1D:
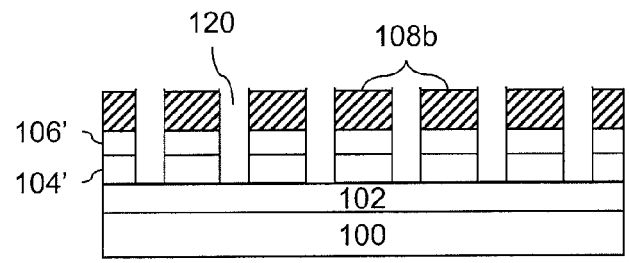

The BARC layer 106, if present, is selectively etched using resist pattern 108b as an etch mask, exposing the underlying hardmask layer 104. The hardmask layer is next selectively etched, again using the resist pattern 108b as an etch mask, resulting in patterned BARC and hardmask layers 106', 104', as shown in FIG. 1D. Suitable etching techniques and chemistries for etching the BARC layer and hardmask layer are known in the art and will depend, for example, on the particular materials of these layers. Dry-etching processes such as reactive ion etching are typical. The resist pattern 108b and patterned BARC layer 106' are next removed from the substrate using known techniques, for example, oxygen plasma ashing.

Figure 1E:
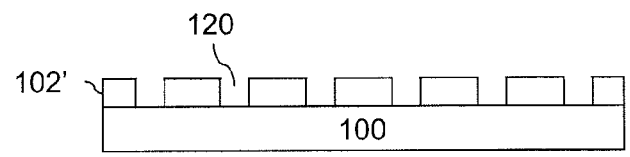

Using the hardmask pattern 104' as an etch mask, the one or more layers 102 are selectively etched. Suitable etching techniques and chemistries for etching the underlying layers 102 are known in the art, with dry-etching processes such as reactive ion etching being typical. The patterned hardmask layer 104' can next be removed from the substrate surface using known techniques, for example, a dry-etching process such as reactive ion etching. The resulting structure is a pattern of etched features 102' as illustrated in FIG. 1E. In an alternative exemplary method, it may be desirable to pattern the layer 102 directly using the resist pattern 108b without the use of a hardmask layer 104. Whether direct patterning is employed will depend on factors such as the materials involved, resist selectivity, resist pattern thickness and pattern dimensions.

The negative tone development methods of the invention are not limited to the exemplary methods described above. For example, the photoresist compositions of the invention can be used in a negative tone development double exposure method for making contact holes. An exemplary such process is a variation of the technique described with reference to FIG. 1, but using an additional exposure of the photoresist layer in a different pattern than the first exposure. In this process, the photoresist layer is exposed to actinic radiation through a photomask in a first exposure step. The photomask includes a series of parallel lines forming the opaque regions of the mask. Following the first exposure, a second exposure of the photoresist layer is conducted through a second photomask that includes a series of lines in a direction perpendicular to those of the first photomask. The resulting photoresist layer includes unexposed regions, once-exposed regions and twice-exposed regions.

Following the second exposure, the photoresist layer is post-exposure baked and developed using a developer as described above. Unexposed regions corresponding to points of intersection of the lines of the two masks are removed, leaving behind the once- and twice-exposed regions of the resist. The resulting structure can next be patterned as described above with reference to FIG. 1. This method is particularly suited to formation of contact holes in the manufacture of electronic devices.

EXAMPLES

Matrix Polymer Synthesis

The following monomers were employed in the syntheses of copolymers in the examples below:

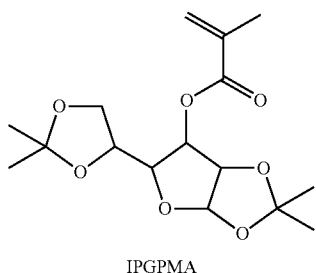

IPGPMA

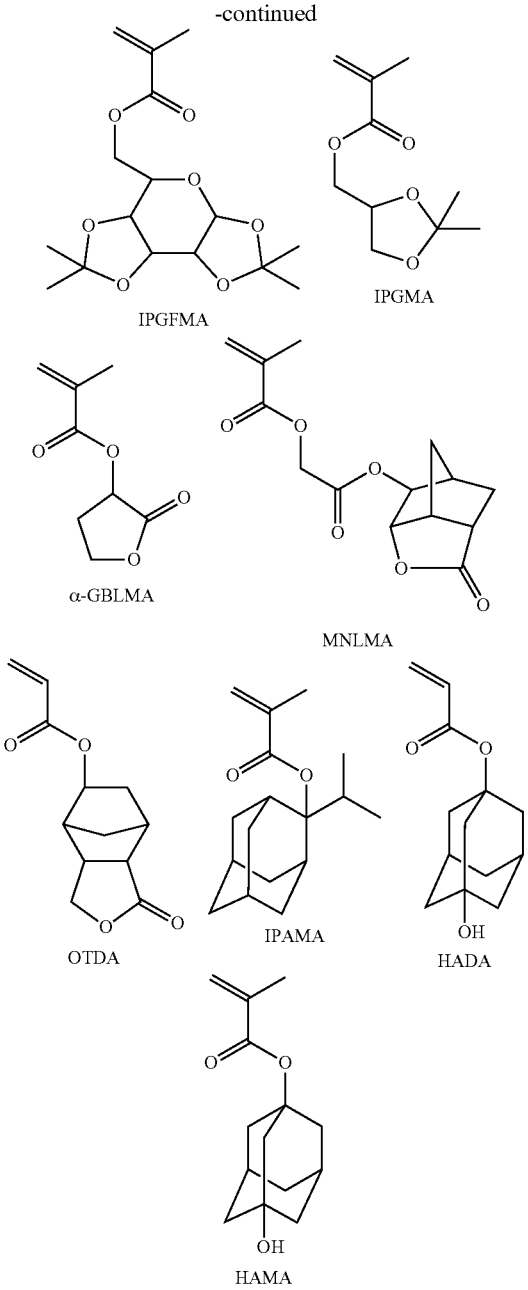

Synthesis of
6-O-methacryloyl-1,2-isopropylidene-DL-glycerin
(IPGMA)

To a solution of DL-1,2-isopropylidenglycrin (98%, 528.0 g, 4.0 mol), anhydrous triethyl amine (600 mL) and anhydrous methylene chloride (1600 mL) at 0° C. was added a solution of methacryloyl chloride (438.9 g, 4.2 mol) in anhydrous methylene chloride (200 mL) drop by drop for 40 minutes. The mixture was stirred using a mechanical stirrer vigorously at room temperature for 2.5 hours. The white precipitate was filtered off. The light yellow solution was washed with distilled water twice (2×1500 mL), sodium bicarbonate saturated water solution twice (2×1500 mL), and then with distilled water (1500 mL) again. The solution was dried using anhydrous magnesium sulfate for 30 minutes. The solution was filtered through a filter paper and the magnesium sulfate phase was washed with anhydrous methylene chloride five times (5×100 mL). All organic phase was combined. Hydroquinone crystals (150 mg) were added as an inhibitor and solvent was removed at 25° C. using a rotary evaporator. The yielding light yellow oil was redissolved in anhydrous THF and passed through a plug of silica gel. Another batch of hydroquinone crystals (75 mg) was added and the solvent was removed under reduced pressure at 25° C. to give a slightly yellow oil, which was dried under vacuum for 48 hours at room temperature to remove traces of solvents. 667.5 g of a yellowish oil was obtained (83.3% yield): $^1$H NMR (500 MHz, CDCl$_3$) δ1.34 (s, 6H), 1.41 (s, 3H), 1.95 (s, 3H), 3.78 (m, 1H), 4.03 (m, 1H), 4.19 (d, 2H), 4.32 (m, 1H), 5.54 (s, 1H), 6.13 (s, 1H).

Synthesis of Poly(IPGPMA/α-GBLMA/MNLMA)

15.77 g of IPGPMA, 6.54 g of α-GBLMA, and 2.69 g of MNLMA were dissolved in 31 g of PGMEA. The mixture was degassed by bubbling with nitrogen for 20 min. A 500 mL flask equipped with a condenser, nitrogen inlet and mechanical stirrer was charged with 18 g of PGMEA and the solution brought to a temperature of 80° C. 1.03 g of V601 (dimethyl-2,2-azodiisobutyrate) dissolved in 1.0 g of PGMEA was charged into the flask. The monomer solution was fed into the reactor at a rate of 13.0 mL/h After 1 h, 0.52 g of V-601 dissolved in 1.0 g of PGMEA was added to the reactor and the monomer feeding was carried out for another 3 hours. After monomer feeding was complete, the polymerization mixture was stirred for an additional 3 hours at 80° C. After a total of 7 hours polymerization time (4 hours feeding and 3 hours stirring), the polymerization mixture was cooled down to room temperature. Precipitation was carried out in 1.0 L of isopropyl alcohol. After filtration, the polymer was dried, re-dissolved in 52 g of THF, re-precipitated into 1.1 L of isopropyl alcohol, filtered, and dried in a vacuum oven at 45° C. for 48 hours to give 18.0 g (Mw=15,239 and Mw/Mn=1.84) of the following "Polymer A":

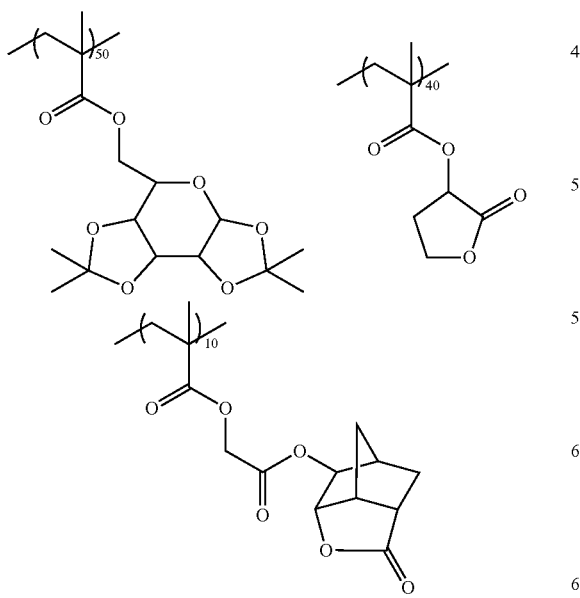

Synthesis of Poly(IPGFMA/α-GBLMA/MNLMA)

15.77 g of IPGPMA, 6.54 g of α-GBLMA, and 2.69 g of MNLMA were dissolved in 31 g of PGMEA. The mixture was degassed by bubbling with nitrogen for 20 min. A 500 mL flask equipped with a condenser, nitrogen inlet and mechanical stirrer was charged with 18 g of PGMEA and the solution brought to a temperature of 80° C. 1.03 g of V601 (dimethyl-2,2-azodiisobutyrate) dissolved in 1.0 g of PGMEA was charged into the flask. The monomer solution was fed into the reactor at a rate of 13.0 mL/h After 1 h, 0.52 g of V-601 dissolved in 1.0 g of PGMEA was added to the reactor and the monomer feeding was carried out for another 3 hours. After monomer feeding was complete, the polymerization mixture was stirred for an additional 3 hours at 80° C. After a total of 7 hours polymerization time (4 hours feeding and 3 hours stirring), the polymerization mixture was cooled down to room temperature. Precipitation was carried out in 1.0 L of isopropyl alcohol. After filtration, the polymer was dried, re-dissolved in 52 g of THF, re-precipitated into 1.1 L of isopropyl alcohol, filtered, and dried in a vacuum oven at 45° C. for 48 hours to give 18.5 g (Mw=14,378 and Mw/Mn=1.75) of the following "Polymer B":

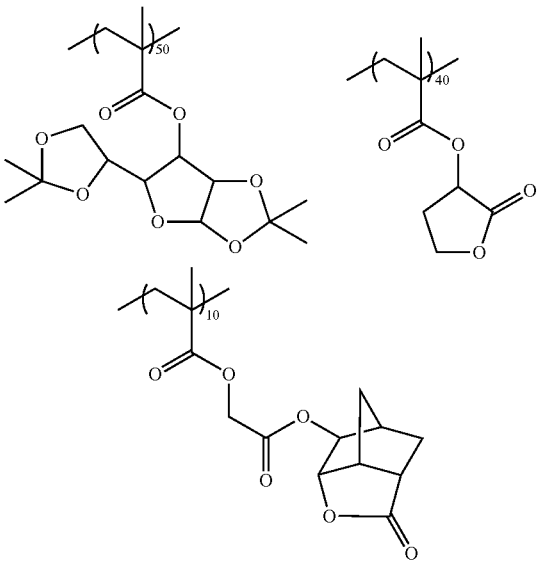

Synthesis of Poly(IPGMA/α-GBLMA/MNLMA)

20.410 g of IPGMA, 13.876 g of α-GBLMA, and 5.714 g of MNLMA were dissolved in 40 g of PGMEA. The mixture was degassed by bubbling with nitrogen for 20 min. A 500 ml flask equipped with a condenser, nitrogen inlet and mechanical stirrer was charged with 53.001 g of PGMEA and the solution brought to a temperature of 80° C. 3.286 g of V601 (dimethyl-2,2-azodiisobutyrate) dissolved in 8.000 g of PGMEA was charged into the flask. The monomer solution was fed into the reactor at a rate of 26.7.00 mL/h. After monomer feeding was complete, the polymerization mixture was stirred for an additional hour at 80° C. After a total of 4 hours polymerization time (3 hours feeding and 1 hour stirring), the polymerization mixture was cooled down to room temperature. Precipitation was carried out in 1.6 L of isopropyl alcohol. After filtration, the polymer was dried, re-dissolved in 91 g of THF, re-precipitated into 1.6 L of isopropyl alcohol, filtered, and dried in a vacuum oven at 60° C. for 48 hours to give 36.7 g (Mw=13,094 and Mw/Mn=2.01) of the following "Polymer C":

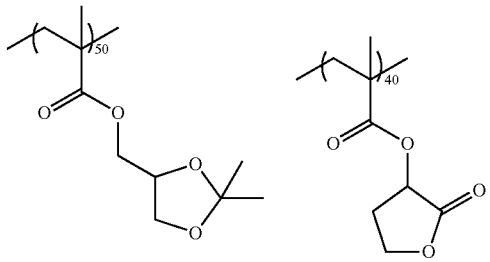

Additive Polymer Synthesis: Poly(n-BMA)

13.01 g of n-butyl methacrylate (nBMA) was dissolved in 7 g of THF. The mixture was degassed by bubbling with nitrogen for 20 min. A 500 mL flask equipped with a condenser, nitrogen inlet and mechanical stirrer was charged with 8 g of THF and the solution brought to a temperature of 67° C. 2.11 g of V601 (dimethyl-2,2-azodiisobutyrate, 10.0 mol % with respect to monomers) was dissolved in 2 g of THF and charged into the flask. The monomer solution was fed into the reactor at a rate of 6.29 mL/h. The monomer feeding was carried out for 3 hours 30 min. After monomer feeding was complete, the polymerization mixture was stirred for an additional 30 min at 67° C. After a total of 4 hours polymerization time (3 hours 30 min feeding and 30 min stirring), 7 g of THF was added to the reactor and the polymerization mixture was cooled down to room temperature. Precipitation was carried out in 0.4 L of cold methanol. After filtration, the polymer was dried in a vacuum oven at 60° C. for 48 hours to give 8.4 g (Mw=12,284 and Mw/Mn=1.79) of the following "Additive A":

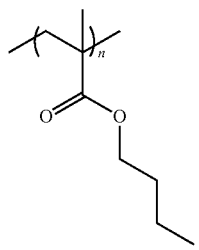

Photoresist Composition Formulation

Example 1 (Comparative)

3.050 g of Polymer A and 0.102 g of Additive A were dissolved in 28.980 g of propylene glycol monomethyl ether acetate (PGMEA), 19.320 g of cyclohexanone, and 48.300 g of methyl-2-hydroxyisobutyreate. To this mixture was added 0.232 g of "PAG A" described below, 0.010 g of 1-(tert-butoxycarbonyl)-4-hydroxypiperidine, and 0.005 g of POLY-FOX® PF-656 surfactant (Omnova Solutions Inc.). The resulting mixture was rolled on a roller for six hours and then filtered through a Teflon filter having a 0.2 micron pore size.

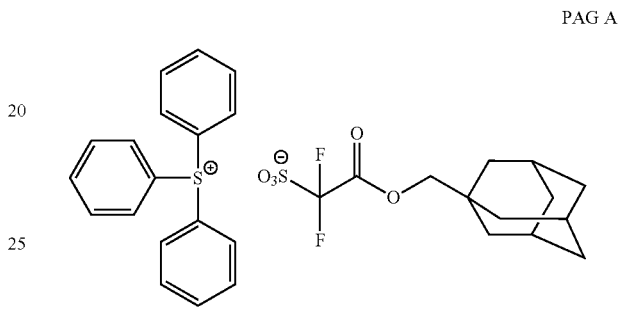

PAG A

Example 2 (Comparative)

3.050 g of Polymer B and 0.102 g of Additive A were dissolved in 28.980 g of propylene glycol monomethyl ether acetate (PGMEA), 19.320 g of cyclohexanone, and 48.300 g of methyl-2-hydroxyisobutyreate. To this mixture was added 0.232 g of "PAG A" described above, 0.010 g of 1-(tert-butoxycarbonyl)-4-hydroxypiperidine, and 0.005 g of POLY-FOX® PF-656 surfactant (Omnova Solutions Inc.). The resulting mixture was rolled on a roller for six hours and then filtered through a Teflon filter having a 0.2 micron pore size.

Example 3

3.050 g of Polymer C and 0.102 g of Additive A were dissolved in 28.980 g of propylene glycol monomethyl ether acetate (PGMEA), 19.320 g of cyclohexanone, and 48.300 g of methyl-2-hydroxyisobutyreate. To this mixture was added 0.232 g of "PAG A" described above, 0.010 g of 1-(tert-butoxycarbonyl)-4-hydroxypiperidine, and 0.005 g of POLY-FOX® PF-656 surfactant (Omnova Solutions Inc.). The resulting mixture was rolled on a roller for six hours and then filtered through a Teflon filter having a 0.2 micron pore size.

Examples 4-9

Photoresist compositions were prepared using the same procedures as Example 1, using PAG B or C with the components and amounts as set forth in Table 1

TABLE 1

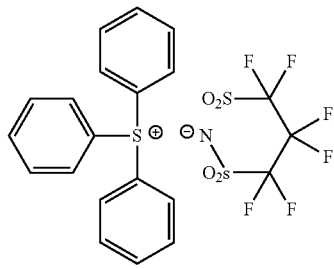

PAG B

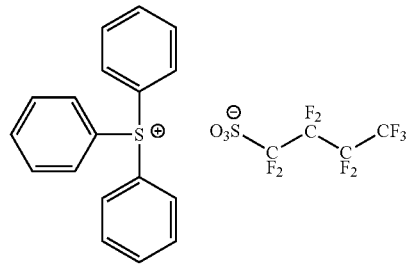

PAG C

| Ex. | Matrix Polymer | Additive A | PAG | Quencher | Surfact. | Solv. A | Solv. B | Solv. C |
|---|---|---|---|---|---|---|---|---|
| 1 (Comp) | A (3.050) | 0.102 | A (0.232) | 0.010 | 0.005 | 28.980 | 19.320 | 48.300 |
| 2 (Comp) | B (3.050) | 0.102 | A (0.232) | 0.010 | 0.005 | 28.980 | 19.320 | 48.300 |
| 3 | C (3.050) | 0.102 | A (0.232) | 0.010 | 0.005 | 28.980 | 19.320 | 48.300 |
| 4 (Comp) | A (3.050) | 0.102 | B (0.220) | 0.010 | 0.005 | 28.980 | 19.320 | 48.300 |
| 5 (Comp) | B (3.050) | 0.102 | B (0.220) | 0.010 | 0.005 | 28.980 | 19.320 | 48.300 |
| 6 | C (3.050) | 0.102 | B (0.220) | 0.010 | 0.005 | 28.980 | 19.320 | 48.300 |
| 7 (Comp) | A (3.050) | 0.102 | C (0.223) | 0.010 | 0.005 | 28.980 | 19.320 | 48.300 |
| 8 (Comp) | B (3.050) | 0.102 | C (0.223) | 0.010 | 0.005 | 28.980 | 19.320 | 48.300 |
| 9 | C (3.050) | 0.102 | C (0.223) | 0.010 | 0.005 | 28.980 | 19.320 | 48.300 |

Quencher: 1-(tert-butoxycarbonyl)-4-hydroxypiperidine;
Surfactant: POLYFOX ® PF-656 (Omnova Solutions Inc.);
Solvent A: propylene glycol monomethyl ether acetate;
Solvent B: cyclohexanone;
Solvent C: methyl-2-hydroxyisobutyrate.
All contents in grams.
"Comp" = comparative example.

Dry Lithographic Process and Contrast Evaluation

Examples 10-18

Dry lithographic processing was carried out to obtain NTD contrast curves for each of the photoresist compositions od Examples 1-9 on 200 mm silicon wafers using a TEL CleanTrack ACT 8 linked to an ASML/1100 scanner with a maximum numerical aperture (NA) of 0.75. Silicon wafers were spin-coated with AR™77 bottom-antireflective coating (BARC) material (Rohm and Haas Electronic Materials) and baked for 60 seconds at 205° C. to yield a film thickness of 840 Å. Photoresist compositions of Examples 1-9 were coated on the BARC-coated wafers and soft-baked at 100° C. for 60 seconds on a TEL CleanTrack ACT 8 coater/developer to provide a resist layer thickness of 1000 Å.

Figure 2:
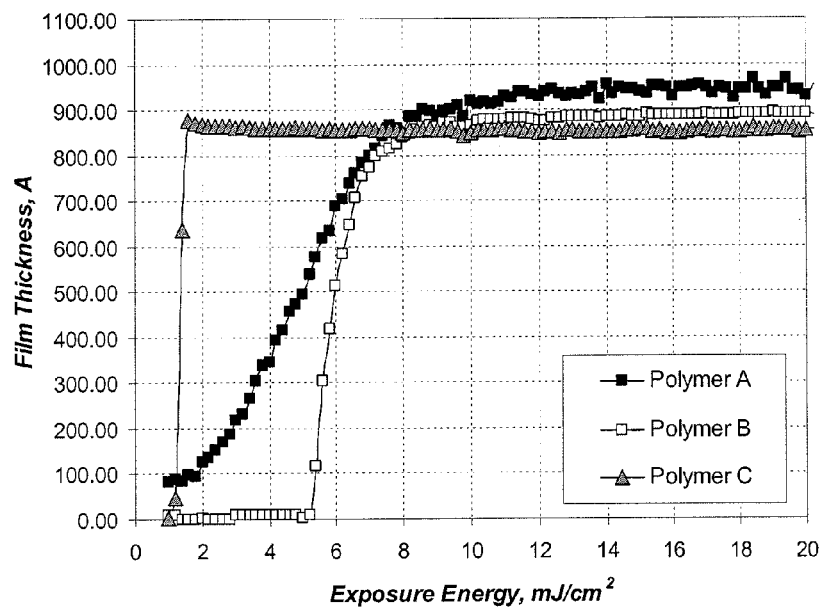
FIGS. 2-4 are contrast curves for photoresist compositions described in the examples.
Figure 3:
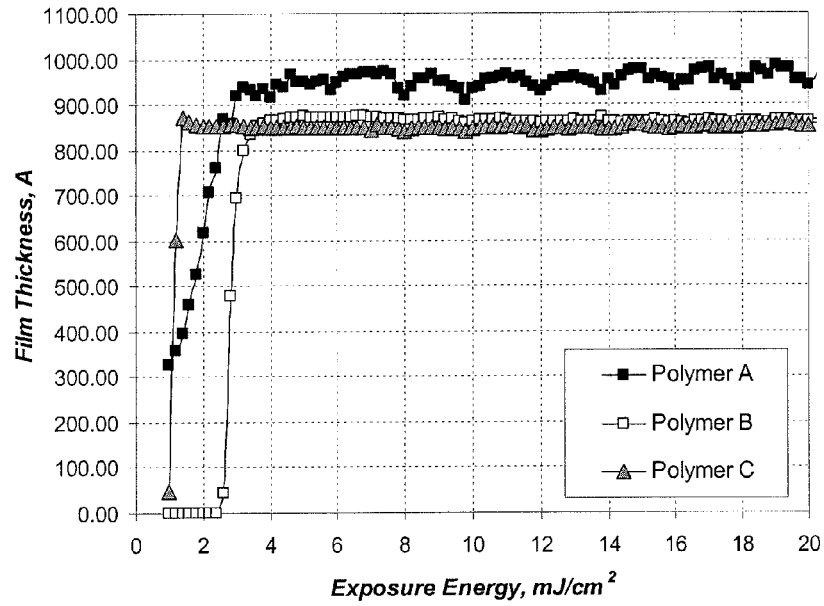
Figure 4:
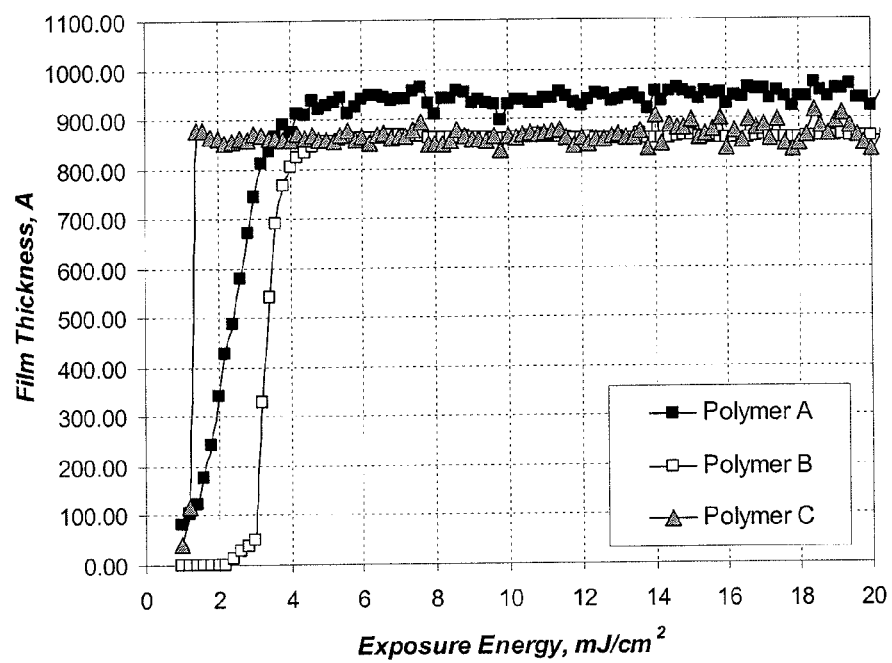

The photoresist-coated wafers were then exposed through a blank mask using 0.75 NA and a Quadrapole 30 illumination condition with 0.89 outer sigma and 0.64 inner sigma. The exposure was carried out with a starting dose of 1.0 mJ/cm$^2$ in increments of 0.2 mJ/cm$^2$ to expose 100 die in a 10×10 array on the wafer in a dose range from 1.0 to 20.8 mJ/cm$^2$. The exposed wafers were post-exposure baked at a temperature of 100° C. for 60 seconds and then developed using 2-heptanone for 25 seconds on a TEL CleanTrack ACT 8 coater/developer. The remaining film thickness for different exposure doses was measured on a ThermaWave Optiprobe (KLA-Tencor) and NTD contrast curves were obtained by plotting remaining film thickness as a function of exposure dose. The resulting contrast curves can be seen in FIG. 2 (Examples 1-3), FIG. 3 (Examples 4-6) and FIG. 4 (Examples 7-9). From the contrast curves, the exposure energy necessary for polarity switch ($E_{ps}$) was determined as the minimum energy to reach constant film thickness. $E_{ps}$, used as a measure of photo-sensitivity of each composition for NTD, is shown in Table 2. As can be seen, $E_{ps}$ is significantly lower (i.e., greater photosensitivity) for Examples 3, 6 and 9 using photoresist compositions in accordance with the invention as compared with Comparative Examples 1, 2, 4, 5, 7 and 8. A similar trend in photosensitivity was observed for the compositions for the three PAGs tested.

TABLE 2

| Ex. | Resist Composition | Matrix Polymer | PAG | $E_{ps}$ |
|---|---|---|---|---|
| 10 (Comp) | Ex. 1 (Comp) | A | A | 12.0 mJ/cm$^2$ |
| 11 (Comp) | Ex. 2 (Comp) | B | A | 10.0 mJ/cm$^2$ |
| 12 | Ex. 3 | C | A | 1.6 mJ/cm$^2$ |

TABLE 2-continued

| Ex. | Resist Composition | Matrix Polymer | PAG | $E_{ps}$ |
|---|---|---|---|---|
| 13 (Comp) | Ex. 4 (Comp) | A | B | 5.0 mJ/cm$^2$ |
| 14 (Comp) | Ex. 5 (Comp) | B | B | 4.0 mJ/cm$^2$ |
| 15 | Ex. 6 | C | B | 1.4 mJ/cm$^2$ |
| 16 (Comp) | Ex. 7 (Comp) | A | C | 6.0 mJ/cm$^2$ |
| 17 (Comp) | Ex. 8 (Comp) | B | C | 5.0 mJ/cm$^2$ |
| 18 | Ex. 9 | C | C | 1.4 mJ/cm$^2$ |

*Immersion lithographic processing for pattern collapse evaluation was not conducted due to insufficient NTD contrast for patterning.

Immersion Lithographic Process

Examples 19-27

300 mm silicon wafers were spin-coated with AR™40A antireflectant (Rohm and Haas Electronic Materials) to form a first bottom antireflective coating (BARC) on a TEL CLEAN TRAC LITHIUS i+ coater/developer. The wafer was baked for 60 seconds at 215° C., yielding a first BARC film thickness of 840 Å. A second BARC layer was next coated over the first BARC using AR™124 antireflectant (Rohm and Haas Electronic Materials), and was baked at 205° C. for 60 seconds to generate a 200 Å top BARC layer. Photoresist formulations of Examples 1-9 were then coated on the dual BARC-coated wafers and soft-baked at 90° C. for 60 seconds on a TEL CLEAN TRACK LITHIUS i+ coater/developer to provide a resist layer thickness of 1000 Å.

The photoresist-coated wafers were exposed through a mask on an ASML TWINSCAN XT:1900i immersion scanner using NA of 1.35 and C-Quad 20 illumination with 0.988 outer sigma, 0.9 inner sigma and XY polarization. The exposed wafers were post-exposure baked at 80 to 100° C. for 60 seconds depending on their relative photo-speeds as listed in Table 3 and then developed using 2-heptanone for 25 seconds on a TEL CLEAN TRACK™ LITHIUS™ i+ coater/developer to give negative tone patterns. Critical dimensions (CDs) were measured on a Hitachi CG4000 CD SEM using a mask CD at 56 nm and a pitch CD at 76 nm to compare the resolution capability of each formulation for ~45 nm contact holes. The results are shown in Table 3. As can be seen, the photoresist compositions of Examples 3, 6, and 9 in accordance with the invention exhibited good resolution, whereas the photoresist compositions of Comparative Examples 1, 2, 4, 5, 7 and 8 resulted in limited or no resolution.

TABLE 3

| Ex. | Resist Composition | Matrix Polymer | PAG | PEB Temp. (° C.) | Resolution |
|---|---|---|---|---|---|
| 19 (Comp) | 1 (Comp) | A | A | 100 | X |
| 20 (Comp) | 2 (Comp) | B | A | 100 | Δ |
| 21 | 3 | C | A | 85 | ○ |
| 22 (Comp) | 4 (Comp) | A | B | 95 | X |
| 23 (Comp) | 5 (Comp) | B | B | 95 | Δ |
| 24 | 6 | C | B | 80 | ○ |
| 25 (Comp) | 7 (Comp) | A | C | 95 | X |
| 26 (Comp) | 8 (Comp) | B | C | 95 | Δ |
| 27 | 9 | C | C | 80 | ○ |

"Comp" = comparative example; resolution was tested for 45 nm contact holes at 76 nm pitch using a mask CD at 56 nm;
X = no resolution;
Δ = limited resolution with hole bridging;
○ = good resolution.

Examples 28-40

Various copolymers were prepared using similar polymerization methods to those described in the above Examples. The monomer units, molar ratios and molecular weight information for the polymers are set forth in Table 4. Photoresist compositions were formed from these polymers using the components and amounts set forth in Table 5, and using similar procedures to those described in the above Examples. Immersion lithography was conducted and good resolution resulted for each of the compositions.

TABLE 4

| Ex. | Polymer | Mon. 1 | Mon. 2 | Mon. 3 | Mon. 4 | Mw | Mn | Mw/Mn |
|---|---|---|---|---|---|---|---|---|
| 28 | D | IPGMA (50) | OTDA (50) | — | — | 11,117 | 5,819 | 1.91 |
| 29 | E | IPGMA (60) | OTDA (20) | aGBLMA (20) | — | 11,607 | 5,861 | 1.98 |
| 30 | F | IPGMA (40) | OTDA (40) | aGBLMA (20) | — | 15,259 | 5,684 | 2.68 |
| 31 | G | IPGMA (60) | OTDA (20) | HAMA (20) | — | 10,974 | 6454 | 1.7 |
| 32 | H | IPGMA (50) | MNLMA (40) | HADA (10) | — | 9585 | 5,427 | 1.77 |
| 33 | I | IPGMA (10) | IPGFMA (40) | OTDA (50) | — | 14,009 | 4,886 | 2.87 |
| 34 | J | IPGMA (10) | IPGFMA (40) | OTDA (35) | HADA (15) | 15,586 | 5,740 | 2.72 |
| 35 | K | IPGMA (25) | IPGPMA (25) | MNLMA (40) | HADA (10) | 15,831 | 9268 | 1.71 |
| 36 | L | IPGMA (25) | IPGPMA (25) | aGBLMA (40) | HADA (10) | 14,264 | 9,000 | 1.58 |
| 37 | M | IPGMA (25) | IPGFMA (25) | MNLMA (40) | HADA (10) | 14,726 | 9,079 | 1.62 |
| 38 | N | IPGMA (25) | IPGFMA (25) | MNLMA (40) | HAMA (10) | 15,112 | 9,542 | 1.58 |
| 39 | O | IPGMA (40) | IPGFMA (10) | aGBLMA (10) | OTDA (40) | 12,965 | 6,490 | 2.00 |
| 40 | P | IPGMA (35) | IPAMA (25) | aGBLMA (30) | MNLMA (10) | 7141 | 4,263 | 1.68 |

( ) = Monomer molar ratio in the feed during the polymerization

TABLE 5

| Ex. | Matrix Polymer | Additive A | PAG | Quencher | Surfact. | Solv. A | Solv. B | Solv. C |
|---|---|---|---|---|---|---|---|---|
| 28 | D (3.050) | 0.102 | A (0.232) | 0.010 | 0.005 | 28.980 | 19.320 | 48.300 |
| 29 | E (3.050) | 0.102 | A (0.232) | 0.010 | 0.005 | 28.980 | 19.320 | 48.300 |
| 30 | F (3.050) | 0.102 | A (0.232) | 0.010 | 0.005 | 28.980 | 19.320 | 48.300 |
| 31 | G (3.050) | 0.102 | A (0.232) | 0.010 | 0.005 | 28.980 | 19.320 | 48.300 |
| 32 | H (3.050) | 0.102 | A (0.232) | 0.010 | 0.005 | 28.980 | 19.320 | 48.300 |
| 33 | I (3.050) | 0.102 | A (0.232) | 0.010 | 0.005 | 28.980 | 19.320 | 48.300 |
| 34 | J (3.050) | 0.102 | A (0.232) | 0.010 | 0.005 | 28.980 | 19.320 | 48.300 |
| 35 | K (3.050) | 0.102 | A (0.232) | 0.010 | 0.005 | 28.980 | 19.320 | 48.300 |
| 36 | L (3.050) | 0.102 | A (0.232) | 0.010 | 0.005 | 28.980 | 19.320 | 48.300 |
| 37 | M (3.050) | 0.102 | A (0.232) | 0.010 | 0.005 | 28.980 | 19.320 | 48.300 |
| 38 | N (3.050) | 0.102 | A (0.232) | 0.010 | 0.005 | 28.980 | 19.320 | 48.300 |
| 39 | O (3.050) | 0.102 | A (0.232) | 0.010 | 0.005 | 28.980 | 19.320 | 48.300 |
| 40 | P (3.050) | 0.102 | A (0.232) | 0.010 | 0.005 | 28.980 | 19.320 | 48.300 |

Quencher: 1-(tert-butoxycarbonyl)-4-hydroxypiperidine;
Surfactant: POLYFOX ® PF-656 (Omnova Solutions Inc.);
Solvent A: propylene glycol monomethyl ether acetate;
Solvent B: cyclohexanone;
Solvent C: methyl-2-hydroxyisobutyrate.
All contents in grams.
"Comp" = comparative example.

What is claimed is:

1. A method of forming a photolithographic pattern, comprising:
   (a) providing a substrate comprising one or more layer to be patterned over a surface of the substrate;
   (b) applying a layer of a photoresist composition over the one or more layer to be patterned, wherein the photoresist composition comprises:
      a polymer, comprising:
         a first unit formed from a monomer of the following general formula (I):

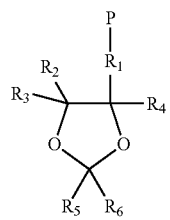

(I)

wherein: P is a polymerizable group; $R_1$ represents a single bond, or a $C_1$ to $C_{10}$ linear or branched alkylene group, or a $C_2$ to $C_{10}$ linear or branched alkenylene group; or a $C_1$ to $C_{10}$ linear or branched organic group; $R_2$ and $R_3$ each independently represents a hydrogen atom or a $C_1$ to $C_{10}$ organic group, together optionally forming a ring; $R_4$ represents a hydrogen atom or a $C_1$ to $C_{10}$ organic group; and $R_5$ and $R_6$ each independently represents a $C_1$ to $C_6$ organic group, together optionally forming a ring; and
         a second unit comprising a lactone moiety;
      wherein the first unit is present in the polymer in an amount of from 30 to 60 mol %; and
      a photoacid generator;
   (c) patternwise exposing the photoresist composition layer to actinic radiation;
   (d) heating the exposed photoresist composition layer in a post-exposure bake process; and
   (e) applying an organic developer to the photoresist composition layer to remove a portion of the photoresist layer, thereby forming a photoresist pattern, wherein unexposed regions of the photoresist layer are removed by the organic developer to form the photoresist pattern.

2. The method of claim 1, wherein $R_5$ and $R_6$ each independently represents a $C_1$ to $C_6$ alkyl group, or together form a $C_3$ to $C_6$ cycloalkyl group.

3. The method of claim 2, wherein $R_2$, $R_3$ and $R_4$ each represent a hydrogen atom.

4. The method of claim 1, wherein P is a polymerizable group of the following formula (P-A):

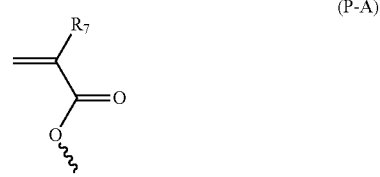

(P-A)

wherein $R_7$ is chosen from hydrogen and C1 to C3 alkyl.

5. The method of claim 1, wherein the polymer further comprises a third unit different from the first and second units and comprising an ether, an ester, a polar group or an acid labile moiety.

6. The method of claim 1, wherein the polymer further comprises a second unit of the general formula (I) which is different from the first unit.

7. The method of claim 1, wherein the photoresist composition further comprises a surface active polymer additive having a surface free energy less than that of the polymer, wherein the surface free energy of the surface active polymer is from 10 to 40 mJ/m².

8. The method of claim 1, wherein the developer comprises 5-methyl-2-hexanone.

9. A method of forming a photolithographic pattern, comprising:
   (a) providing a substrate comprising one or more layer to be patterned over a surface of the substrate;
   (b) applying a layer of a photoresist composition over the one or more layer to be patterned, wherein the photoresist composition comprises:

a polymer, comprising:
  a first unit formed from a monomer of the following general formula (I):

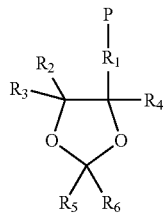

(I)

wherein: P is a polymerizable group; $R_1$ represents a single bond, or a $C_1$ to $C_{10}$ linear or branched alkylene group, or a $C_2$ to $C_{10}$ linear or branched alkenylene group; or a $C_1$ to $C_{10}$ linear or branched organic group; $R_2$ and $R_3$ each independently represents a hydrogen atom or a $C_1$ to $C_{10}$ organic group, together optionally forming a ring; $R_4$ represents a hydrogen atom or a $C_1$ to $C_{10}$ organic group; and $R_5$ and $R_6$ each independently represents a $C_1$ to $C_6$ organic group, together optionally forming a ring; and
  a second unit comprising a lactone moiety; and
a photoacid generator;
(c) patternwise exposing the photoresist composition layer to actinic radiation;
(d) heating the exposed photoresist composition layer in a post-exposure bake process; and
(e) applying an organic developer to the photoresist composition layer to remove a portion of the photoresist layer, thereby forming a photoresist pattern, wherein the developer comprises 2-heptanone, and wherein unexposed regions of the photoresist layer are removed by the organic developer to form the photoresist pattern.

10. A method of forming a photolithographic pattern, comprising:
(a) providing a substrate comprising one or more layer to be patterned over a surface of the substrate;
(b) applying a layer of a photoresist composition over the one or more layer to be patterned, wherein the photoresist composition comprises:
  a polymer, comprising:
    a first unit formed from a monomer of the following general formula (I):

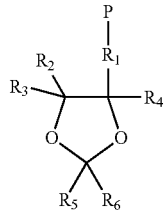

(I)

wherein: P is a polymerizable group; $R_1$ represents a single bond, or a $C_1$ to $C_{10}$ linear or branched alkylene group, or a $C_2$ to $C_{10}$ linear or branched alkenylene group; or a $C_1$ to $C_{10}$ linear or branched organic group; $R_2$ and $R_3$ each independently represents a hydrogen atom or a $C_1$ to $C_{10}$ organic group, together optionally forming a ring; $R_4$ represents a hydrogen atom or a $C_1$ to $C_{10}$ organic group; and $R_5$ and $R_6$ each independently represents a $C_1$ to $C_6$ organic group, together optionally forming a ring; and
  a second unit comprising a lactone moiety; and
a photoacid generator;
(c) patternwise exposing the photoresist composition layer to actinic radiation;
(d) heating the exposed photoresist composition layer in a post-exposure bake process; and
(e) applying an organic developer to the photoresist composition layer to remove a portion of the photoresist layer, thereby forming a photoresist pattern, wherein unexposed regions of the photoresist layer are removed by the organic developer to form the photoresist pattern, and wherein the photolithographic pattern is formed without use of a cleaning rinse following development.

11. A method of forming a photolithographic pattern, comprising:
(a) providing a substrate comprising one or more layer to be patterned over a surface of the substrate;
(b) applying a layer of a photoresist composition over the one or more layer to be patterned, wherein the photoresist composition comprises:
  a polymer, comprising:
    a first unit formed from a monomer of the following general formula (I):

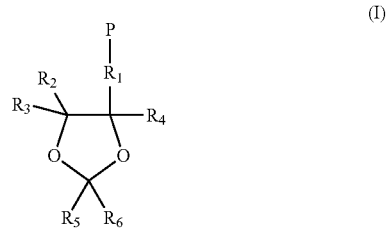

(I)

wherein: P is a polymerizable group; $R_1$ represents a single bond, or a $C_1$ to $C_{10}$ linear or branched alkylene group, or a $C_2$ to $C_{10}$ linear or branched alkenylene group; or a $C_1$ to $C_{10}$ linear or branched organic group; $R_2$ and $R_3$ each independently represents a hydrogen atom or a $C_1$ to $C_{10}$ organic group, together optionally forming a ring; $R_4$ represents a hydrogen atom or a $C_1$ to $C_{10}$ organic group; and $R_5$ and $R_6$ each independently represents a $C_1$ to $C_6$ organic group, together optionally forming a ring; and
  a second unit comprising a lactone moiety; and
a photoacid generator;
wherein the photoresist composition is free of acid labile groups other than in units formed from the monomer of general formula (I);
(c) patternwise exposing the photoresist composition layer to actinic radiation;
(d) heating the exposed photoresist composition layer in a post-exposure bake process; and
(e) applying an organic developer to the photoresist composition layer to remove a portion of the photoresist layer, thereby forming a photoresist pattern, wherein unexposed regions of the photoresist layer are removed by the organic developer to form the photoresist pattern.

* * * * *